United States Patent [19]

Ide et al.

[11] Patent Number: 4,908,292

[45] Date of Patent: Mar. 13, 1990

[54] METHOD OF MAKING AN ELECTROPHOTOGRAPHIC INORGANIC PHOTOSENSITIVE ELEMENT USING ULTRAVIOLET RADIATION

[75] Inventors: Yukio Ide, Mishima; Kohichi Ohshima, Numazu; Itaru Fujimura, Numazu; Yoshiyuki Kageyama, Numazu, all of Japan

[73] Assignee: Ricoh Company, Ltd., Tokyo, Japan

[21] Appl. No.: 217,036

[22] Filed: Jul. 11, 1988

Related U.S. Application Data

[63] Continuation of Ser. No. 936,973, Nov. 26, 1986, abandoned, which is a continuation-in-part of Ser. No. 906,591, Sep. 9, 1986, abandoned, which is a continuation of Ser. No. 475,845, Mar. 16, 1983, abandoned.

[30] Foreign Application Priority Data

Mar. 17, 1982 [JP] Japan ................................. 57-40673

[51] Int. Cl.$^4$ ............................................. G03G 5/082
[52] U.S. Cl. ..................................... 430/128; 430/130; 430/135
[58] Field of Search ................ 430/133, 128, 130, 135

[56] References Cited

U.S. PATENT DOCUMENTS

| | | | |
|---|---|---|---|
| 4,138,306 | 2/1979 | Niwa | 156/646 |
| 4,348,428 | 9/1982 | Rockley et al. | 427/85 |
| 4,349,617 | 9/1982 | Kawashiri et al. | 430/65 |
| 4,409,308 | 10/1983 | Shimizu et al. | 430/65 |
| 4,418,132 | 11/1983 | Yamazaki | 430/84 |
| 4,438,188 | 3/1984 | Shimatani | 430/128 |

*Primary Examiner*—J. David Welsh
*Attorney, Agent, or Firm*—Oblin, Spivak, McClelland, Maier & Neustadt

[57] ABSTRACT

A method and apparatus of manufacturing a photosensitive member including an electrically conductive support and a photoconductive layer formed on said support for use in electrophotography is characterized by including the steps of introducing a reacting gas containing predetermined components for forming said photoconductive layer on said support into said reaction chamber and irradiating ultraviolet light to activate said predetermined components while maintaining said support at a predetermined temperature thereby causing said predetermined components to be deposited onto said support.

13 Claims, 5 Drawing Sheets

METHOD OF MAKING AN ELECTROPHOTOGRAPHIC INORGANIC PHOTOSENSITIVE ELEMENT USING ULTRAVIOLET RADIATION

BACKGROUND OF THE INVENTION

This application is a continuation of application Ser. No. 936,973 filed on Nov. 26, 1986, now abandoned, which is a continuation-in-part application from application Ser. No. 906,591 filed Sept. 9, 1986, now abandoned, which was a continuation of Ser. No. 475,845 filed Mar. 16, 1983, now abandoned.

1. Field of the Invention

This invention relates to a method and apparatus of manufacturing a photosensitive member, and, in particular, to a manufacturing method of a photosensitive member on the basis of the low pressure chemical vapor deposition technology.

2. Description of the Prior Art

In electrophotographic copying technology, use has been and is being made of a photosensitive member as an image carrier on which is formed an electrostatic latent image which is then developed into a visual toner image. Such a photosensitive member is, typically, comprised of an electrically conductive support and a photoconductive layer formed on the support from a material exhibiting photoconductive characteristics. Recently, attention has been focused on amorphous silicon (a-Si) having high hardness and excellent durability as a material for forming the photoconductive layer of a photosensitive member, and studies have been and are being made on possible application of this material to the field of electrophotographic copying machines because of absence of possibility of creating pollutions in manufacturing photosensitive members as different from those using arsenic (As) as a photoconductive material.

In forming a layer of amorphous silicon on an electrically conductive support, use has been made of the so-called plasma enhanced CVD (PECVD) such as the glow discharge method. However, when use is made of PECVD, it is extremely difficult to create a glow discharge with high reproducibility and stability. For this reason, when used, one will encounter various disadvantages such as low reproducibility in properties of a resulting layer or film, necessity for maintaining the substrate at a high temperature ranging from 200° to 400° C. in order to obtain desired properties, likelihood of causing damages to the surface of the substrate by plasma, extremely low growth rate, and lack of satisfactory uniformity in the resulting layer or film because the film formation is sensitive to electron temperature distribution, electron density distribution, gas concentration distribution, etc, of plasma.

SUMMARY OF THE INVENTION

The disadvantages of the prior art are overcome and an improved method and apparatus for manufacturing a photosensitive member is presented in accordance with the present invention. The present invention is characterized by utilizing the photochemical reaction due to ultraviolet light and it has its object to provide an improved method capable of manufacturing a photosensitive member of excellent quality using a relatively low temperature with high reproducibility and stability. Briefly stated, in accordance with the present invention, there is provided a method of manufacturing a photosensitive member comprising the steps of: providing an electrically conductive support in a reaction chamber; introducing a reacting gas containing predetermined components for forming a photoconductive layer on said support into said reaction chamber; and irradiating ultraviolet light to activate said predetermined components while maintaining said support at a predetermined temperature thereby causing said predetermined components to deposit on said support. In the preferred embodiment, silicon hydride, in particular $SiH_4$, is contained in the reacting gas so as to form at least part of the resulting photoconductive layer by amorphous silicon.

DESCRIPTION OF THE PREFERRED EMBODIMENTS

Figure 1:
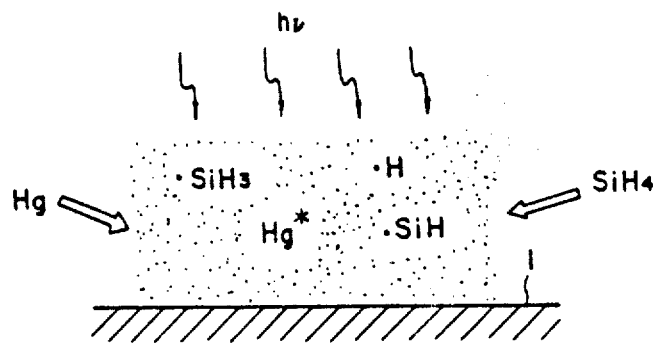
FIG. 1 is a schematic illustration showing the principle of reaction in accordance with the present invention.

Referring now to FIG. 1, there is shown the principle of reaction in producing a layer of amorphous silicon in accordance with the present invention. In the first place, an electrically conductive support or substrate 1 is provided in a reaction chamber (not shown in FIG. 1) which is so structured to allow admission of several kinds of gases. Then, as a reacting gas, a gas containing silicon hydride, in particular $SiH_4$, is introduced to the vicinity of the surface of the substrate 1, and, at the same time, mercury (Hg) vapor is added so as to promote the photochemical reaction. Then, ultraviolet light having frequency $\nu$ is irradiated to the reacting gas in the vicinity of the surface of the substrate 1. Then, the Hg vapor becomes photoexcited as indicated in the following expression (1).

where, $Hg^*$: photoexcited Hg atoms.

Then, the thus photoexcited $Hg^*$ and the $SiH_4$ in the reacting gas react each other as indicated in the following expressions (2) to produce activated silicon hydride molecules in the vicinity of the surface of the substrate 1.

$$Hg^* + SiH_4 \rightarrow SiH + H + H_2 + Hg \qquad (2b)$$

where, SiH₃, SiH and H are activated molecules or atoms of SiH₃, SiH and H, respectively.

That is, due to reaction between Hg* and SiH₄, activated molecules or atoms such as SiH₃, SiH and H are produced in the vicinity of the surface of the substrate 1. And, thus, the activated molecules such as SiH₃ and SiH are deposited on the surface of the substrate 1 thereby forming a layer of amorphous silicon on the surface of the substrate 1. In this manner, through the Hg vapor as a reaction promoting agent, the SiH₄ gas and ultraviolet light react photochemically each other to form a layer of amorphous silicon on the surface of the substrate 1.

Figure 2:
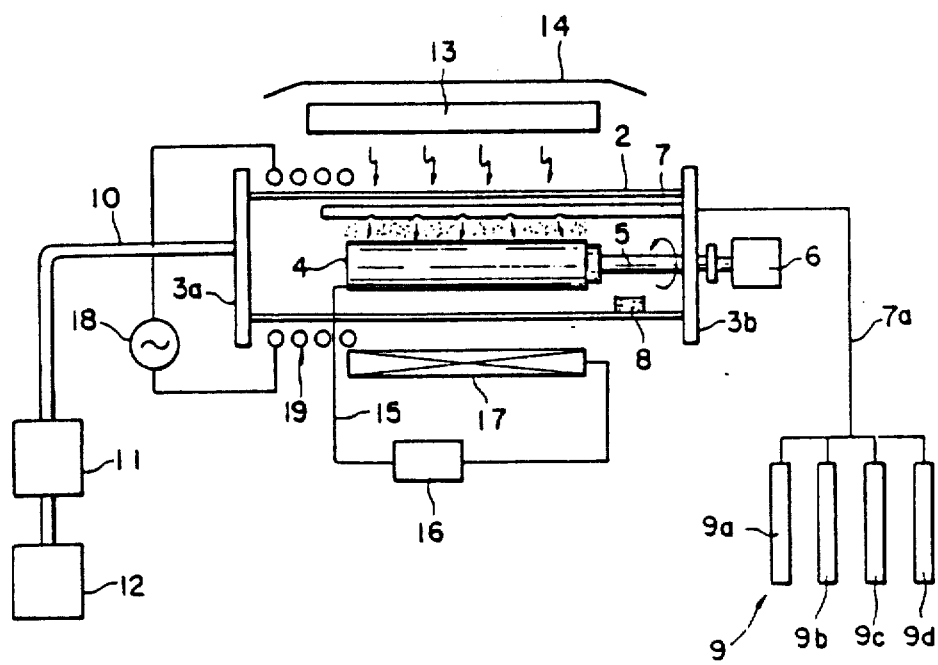
FIG. 2 is a schematic illustration showing one example of an apparatus for practicing the present invention.

Referring now to FIG. 2, showing one example of the apparatus for carrying out the present method, a cylindrical reaction tube 2 of quartz is supported in position with both end openings closed by end plates 3a and 3b, as shown. Inside the reaction tube 2 is provided a cylindrical support 4 of Al, which will eventually form an electrically conductive support of a resulting photosensitive member, as attached with its one end to a mounting shaft 5, which sealingly extends through the end plate 3b and is provided to be rotatable. The far end of the shaft 5 is fixedly connected to the driving shaft of a motor 6. Thus, when the motor 6 is driven to rotate, the cylindrical support 4 also rotates around its center axis as indicated by the arrow. Also provided inside of the reaction tube 2 is a gas introducing tube 7 which is located above and spaced apart from the cylindrical support 4 and which extends generally in parallel with the cylindrical support 4.

The gas introducing tube 7 is supported by the end plate 3b, and it is connected to a group 9 of gas sources through a conduit 7a. The gas sources 9a, 9b, 9c and 9d store Freon (CF₄) gas, hydrogen (H₂) gas, nitrogen (N₂) gas and SiH₄ gas, respectively. Although not shown specifically, it should be understood that valves and flow control units are appropriately provided so that a desired gas or mixture gas may be supplied to the reaction tube 2 at a desired flow rate as obvious for those skilled in the art. Furthermore, mercury 8 is located inside of the tube 2 as stored in an appropriate container.

Another conduit 10 sealingly extends through the other end plate 3a and the other end of the conduit 10 is fluiddynamically connected to a vacuum pump 12 such as a rotary pump through a cold trap 11. An induction coil 19 is provided as fitted onto the tube 2 at the location closer to the end plate 3a, and the induction coil 19 is electrically connected to a high frequency oscillator 18.

Moreover, at the position above and separated from the reaction tube 2 is disposed a light source 13 for irradiating ultraviolet light to the cylindrical support 4 inside the reaction tube 2. The light source 13 extends generally in parallel with the reaction tube 2, and, as an example, a low pressure mercury lamp of 500 W which emits ultraviolet light having the main wave length of 253.7 nm may be used for this purpose. Above the light source 13 is disposed a reflecting mirror 14 which will aid the light emitting from the light source 13 in directing toward the surface of the cylindrical support 4.

On the other hand, below the reaction tube 2 is disposed an infrared heater 17. A thermocouple 15 is provided with its probe end in contact with an appropriate point of the cylindrical support 4. The other end of the thermocouple 15 is connected to a temperature controller 16, which is also connected to the heater 17. Thus, in response to the temperature of the support 4 detected by the thermocouple 15, the temperature controller 16 controls the operating condition of the infrared heater 17 so as to maintain the temperature of the support 4 at a desired level.

When manufacturing a photosensitive member using such an apparatus as shown in FIG. 2, the end plates 3a and/or 3b are first detached from the reaction tube 2. Then, a container containing therein a quantity of mercury 8 is positioned inside of the tube 2. After mounting the electrically conductive cylindrical support 4 to the mounting shaft 5 and mounting the thermocouple 15 in contact with the support 4, the detached end plate or plates are sealingly attached to the tube 2. Then, the interior of the reaction tube 2 is evacuated by the vacuum pump 12 thereby establishing the vacuum condition of, for example, $10^{-3}$ Torr in the reaction tube 2. Thereafter, N₂ gas is introduced into the reaction tube 2 from the gas source 9c via the conduit 7a and the gas introducing tube 7, thereby filling the reaction tube 2 with N₂ gas of, for example, 2 Torr. Then, the cylindrical support 4 is driven to rotate by the motor 6 while maintaining the temperature of the support 4 approximately at 170° C. as heated by the infrared heater 17 under the control of the temperature controller 16. Then, while irradiating ultraviolet light having the wave length of, for example, 253.7 nm to the cylindrical support 4 form the light source 13, a mixture gas of SiH₄ and N₂ gases at the mixture ratio of approximately 1:7.5 by volume, for example, is introduced into the reaction tube 2 as supplied from the gas sources 9d and 9c. N₂ gas is mixed with SiH₄ gas as a diluting gas.

Under the circumstances, in the vicinity of the cylindrical support 4 are present Hg vapor evaporated at low pressure conditions from the mercury source 8 and SiH₄ gas. Accordingly, when they are irradiated by the ultraviolet light, the photochemical reactions as shown by the expressions (1) and (2) take place, and, thus, the activated Si molecules (SiH, SiH₃, etc.) are deposited onto the peripheral surface of the cylindrical support 4. During this deposition, since the cylindrical support 4 continues its rotation, a layer of amorphous silicon is uniformly formed on the peripheral surface of the cylindrical support 4. Then, the introduction of reacting and diluting gases is terminated, so are the irradiation of ultraviolet light and the infrared heating. Then, after disassembling the reaction tube 2, the conductive support 4 on which is now formed a layer of amorphous silicon is taken out of the reaction tube 2. Then, the reaction tube 2 is again assembled, and CF₄ gas is introduced into the reaction tube 2 as supplied from the gas source 9a. At the same time, the high frequency oscillator 18 is set in operation to cause a high frequency discharge in the CF₄ gas, so that the amorphous silicon deposited onto the inner surface of the reaction tube 2 is subjected to plasma etching and thus the inner surface of the reaction tube 2 is cleaned.

As described above, when a photosensitive member is manufactured in accordance with the present invention, one can obtain a photosensitive member which is uniform in characteristic and high in reproducibility as well as in stability. In order to examine the effects of the present invention, a photosensitive member has been actually manufactured under the following conditions.

Conductive support: Al drum having outer diameter of 80 mm and length of 300 mm.

Light source: Low pressure mercury lamp of 500 W having main wavelength of 253.7 nm.
Reacting gas: SiH$_4$ gas at flow rate 20 ml/m.
Diluting gas: N$_2$ gas at flow rate 150 ml/m.
Rotational speed of support 4: 10 r.p.m.
Temperature of support 4: 170° C.
Gas pressure inside reaction tube 2: 2 Torr.

Under the above-described conditions, a layer of amorphous silicon is formed to the thickness of 15 microns, and it has been found that the quality of the thus formed layer of amorphous silicon is extremely suitable for use as a photoconductive layer of a photosensitive member to be used in electrophotography. Moreover, the above-described operation has been carried out repetitively to produce a number of photosensitive members, and the thus produced photosensitive members have been found to be of uniform in characteristics, indicating a high reproducibility and stability of the present method. It should also be noted that since the photochemical reaction is mild in nature as a whole, there is no danger of attacking the surface of the substrate or support.

As described in detail above, in accordance with the present invention, the reacting gas containing the components for forming a photoconductive layer are photochemically reacted by irradiation of ultraviolet light and the thus activated components are deposited onto the surface of a conductive support thereby forming a photosensitive member. Thus, there is no need to carry out impedance matching of high frequency so as to stabilize plasma and to take measures against contamination of electrodes as required in the customary plasma CVD method. Furthermore, no fine adjustments in supplying gases and producing plasma are required in the present invention. This is because, the plasma energy density distribution has a very wide distribution; whereas, the energy density of the activated molecules produced by the photochemical reaction has an extremely limited range, which indicates that the present invention allows to manufacture photosensitive members uniform in characteristic and high in reproducibility as well as in stability with ease. Furthermore, in the present method, the substrate or support may be maintained at a relatively low temperature, i.e., 200° C. or lower, and the apparatus for manufacturing photosensitive members is rather simple in structure, and, therefore, the probability of occurrence of trouble is minimized.

When forming a photosensitive member for use in electrophotography from amorphous silicon, it is preferable to include a gas containing at least one of elements C, N and O. The inclusion of such element in amorphous silicon allows to obtain an increased dark resistance so that there may be provided a photosensitive member having an increased charge retainability, which is quite advantageous for use in electrophotography. In this aspect of the present invention, there is provided a method of manufacturing a photosensitive member for use in electrophotography, including an electrically conductive support and a photoconductive layer of amorphous silicon formed on the support, which comprises the steps of: placing the electrically conductive support in a reaction chamber; introducing SiH$_4$ and a gas containing at least one of elements C, N and O for forming the photoconductive layer on the support into the reaction chamber; and irradiating ultraviolet light to activate SiH$_4$ and the gas while maintaining the support at a predetermined temperature thereby causing SiH$_4$ with at least one of elements C, N and O to deposit on the support through photoexcitation.

With introduction of at least one of C, N and O, the energy gap of the resulting amorphous silicon film is broadened thereby allowing to obtain an increased electrical resistance. For the introduction of C, use may be preferably made of such gas as $C_nH_{2n+2}$ (n is equal to or larger than 1, but equal to or smaller than 4), $C_nH_{2n}$ (n is equal to or larger than 1, but equal to or smaller than 4), and $C_2H_2$. For the introduction of N, use may be preferably made of the gas containing NH$_3$ or N$_2$H$_4$. For example, in the case of forming a film of a-Si:N:H, it is preferable to set the gas flow ratio between SiH$_4$ and NH$_3$ to be 1:25. Furthermore, for the introduction of O, use may be preferably made of source gases such as N$_2$O, O$_2$, or O$_3$.

As mentioned before, in order to form an amorphous silicon film on a substrate, such as the electrically conductive support 4 shown in FIG. 2, it is preferable to maintain the temperature of the substrate in a selected range during formation of the a-Si film by photoexcitation. Specifically, the temperature may be maintained in a range between 100° and 350° C., more preferably in a range between 150° and 300° C. In addition, the pressure inside of the reaction chamber 2 should be maintained in a range between 0.1 and 5 Torr. When manufactured under these conditions, there is obtained an a-Si film excellent and uniform in photoconductive characteristic.

It is also preferable that the gas additionally contains impurities for doping so as to bring the resulting Fermi level to be located approximately at the center of the bandgap. In this respect, since the undoped amorphous silicon is somewhat N type conductivity, use should, for example, be made of B$_2$H$_6$ so as to have B doped in the resulting amorphous silicon.

When manufacturing a photoconductive film, particularly suited for use in electrophotography, from amorphous silicon by photoexcitation, i.e., with the irradiation of ultraviolet light to the gas containing SiH$_4$ as described above, the gas containing SiH$_4$ is introduced into a reaction chamber 2, as shown in FIG. 2, and the gas inside the reaction chamber 2 is irradiated by the light source 13 disposed outside of the reaction chamber 2. Accordingly, the ultraviolet light emitted from the light source 13 must pass through the wall of the reaction chamber 2 so as to cause photoexcitation of the gas contained in the reaction chamber 2. With such a structure, the photoexcited components are deposited not only on the substrate, such as the cylindrical support 4, but also on the inner wall surface of the reaction chamber 2. Such a deposition on the inner wall surface is disadvantageous because it tends to block the ultraviolet light emitted from the light source 13 thereby lowering the deposition rate on the substrate 4.

Figure 3:
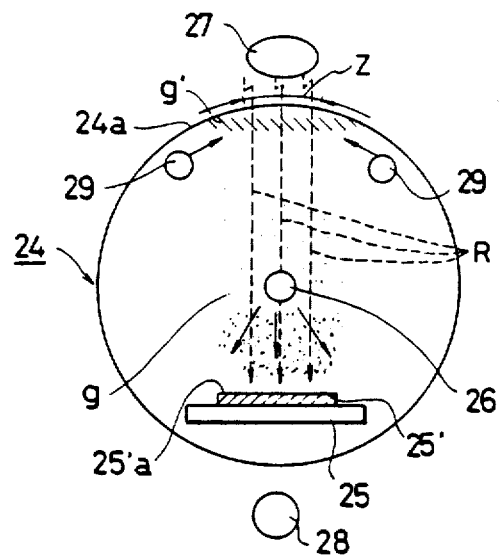
FIG. 3 is a schematic illustration showing the photochemical vapor phase growth apparatus constructed in accordance with one embodiment of the present invention.

FIG. 3 shows apparatus for manufacturing a photosensitive member, particularly suited for use in electrophotography, using photoexcitation construed in accordance with one embodiment of the present invention. As shown, there is provided a reaction chamber 24, which is preferably cylindrical in shape. In the illustrated embodiment, the cylindrical wall of the reaction chamber 24 is entirely comprised of quartz which allows light to transmit therethrough; however, as an alternative, it may be so structured that that portion of the cylindrical wall of the reaction chamber 24 which is opposite to a light source 27 is comprised of a light-transmitting material, such as quartz, with the rest being comprised of another material, such as heat-resistant material, which could be light-transmitting or not.

Inside of the reaction chamber 24 is disposed a plate shaped support 25 on which is placed a substrate 25' in the form of a plate for forming thereon a photoconductive film from amorphous silicon by the reaction of photoexcitation CVD. A reaction gas introducing pipe 26 extends into the interior of the reaction chamber 24 with its supply end port located approximately at the center of the reaction chamber 24. The pipe 26 is connected from an exterior gas source (not shown) and it supplies a reaction gas g into the reaction chamber 24 as being blown against the surface of the substrate 25'. It is to be noted that mercury vapor, which serves as a promotor in the photoexcited CVD reaction, is also supplied into the reaction chamber 24 through the pipe 26. It should be noted that the substrate 25' on which a photoconductive film is to be formed is plate-shaped in FIG. 3, it may take any shape such as a cylindrical shape as shown in FIG. 2, in which case the cylindrical substrate should be set in rotation during the formation of a photoconductive film on its outer peripheral surface.

The light source 27 disposed outside of the reaction chamber 24 is typically a low-pressure mercury lamp capable of emitting ultraviolet light R having wavelength of, for example, 2,537 angstroms. The light source 27 is preferably disposed at the position such that the light emitted from the light source 27 impinges on the surface of the substrate 25' as passing through a region where the reaction gas g is supplied into the reaction chamber 24 from the pipe 26, as shown in FIG. 3. With such an arrangement, the ultraviolet light R emitted from the light source 27 can be efficiently irradiated to the top surface 25a40 of the substrate 25' which is opposite to the supply port of the pipe 26, so that photoexcited CVD process can be carried out efficiently at the top surface 25a' of the substrate 25 on which a photoconductive film is to be formed. It should be noted that as the light source 27, other than a low-pressure mercury lamp, use may be made of any light source as long as it can supply a beam of optical energy which is equal to or more than that supplied by the low-pressure mercury lamp. Also disposed outside of the reaction chamber 24 and at the side opposite to the side where the light source 27 is provided is a heater 28 for heating the substrate 25' to a predetermined temperature range.

A pair of pipes 29, 29 for ejecting a purging gas g', such as an inert gas, extends into the reaction chamber 24 with their exit ports located near the top inner surface of the cylindrical wall of the reaction chamber 24. As indicated by the arrows, the purging gas g' introduced into the reaction chamber 24 from these pipes 29, 29 is directed specifically to that portion Z of the inner surface 24a of the cylindrical wall of the reaction chamber 24 which is located in the optical path for the light emitted from the light source 27 to be impinged on the top surface 25i a' of the substrate 25. Thus, the purging inert gas g' mainly stays in a region adjacent to the top inner surface 24a of the cylindrical wall thereby preventing the reaction gas g from coming into contact with that portion of the inner surface. The purging gas g' must be an inert gas which is stable in terms of photoexcited CVD process and which is not substantially decomposed by the irradiation of the ultraviolet light R, and the preferred gas includes He, Ar, Xe and $N_2$.

With such a structure as shown in FIG. 3, since the deposition of a product of photoexcited CVD reaction taking place in the reaction chamber 24 onto that portion of the inner surface 24a indicated by the region Z is prevented from occurring, and, thus, the region Z may be maintained free of deposition during the reaction. As a result, the ultraviolet light R emitted from the light source 27 can reach the top surface 25a' of the substrate 25' without being blocked on the way.

Figure 4:
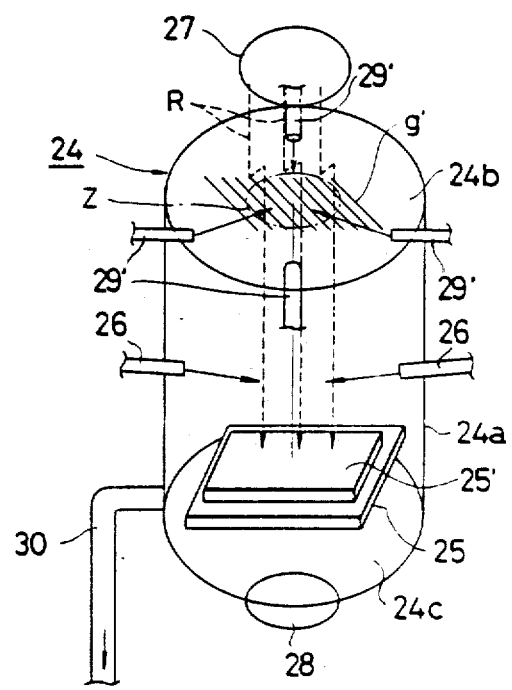
FIG. 4 is a schematic illustration in perspective showing the photochemical vapor phase growth apparatus constructed in accordance with another embodiment of the present invention.

FIG. 4 shows another embodiment of the apparatus for manufacturing a photosensitive member according to photoexcited CVD process embodying the present invention. Since the embodiment shown in FIG. 4 is basically the same in structure as the embodiment of FIG. 3, like elements are indicated by like numerals. In contrast to the radial arrangement of the light source 27 and the heater 28 with respect to the cylindrical reaction chamber 24 in the embodiment of FIG. 3, the axial arrangement is adopted in the embodiment of FIG. 4. That is, in the embodiment shown in FIG. 4, the light source 27 is disposed opposite to a top end plate 24b of the reaction chamber 24. And, the support 25 for supporting thereon the substrate 25' is also arranged with their top surfaces perpendicular to the longitudinal axis of the cylindrical reaction chamber 24. A plurality (two in the illustrated embodiment) of pipes 26, 26 extend into the interior of the reaction chamber 24 with their supply ports located to direct a reaction gas against the top surface of the substrate 25'. Also provided are a plurality (two in the illustrated embodiment) of pipes 29', 29' as extending into the reaction chamber 24 for supplying a purging inert gas at least to that portion of the inner surface of the top end plate 24b which is indicated by a shaded area g'. This is the area where the light emitted from the light source 27 to reach the top surface of the substrate 25'. Accordingly, the inner surface of the end plate 24b, or at least the shaded area, is maintained free of deposition of a product from the photoexcited CVD process. The heater 28 for maintaining the substrate 25' in a predetermined temperature range is disposed outside of the reaction chamber 24 and opposite to its bottom end plate 24c. In addition, a discharge pipe 30 is also provided for evacuating the reaction chamber 24.

Figure 5:
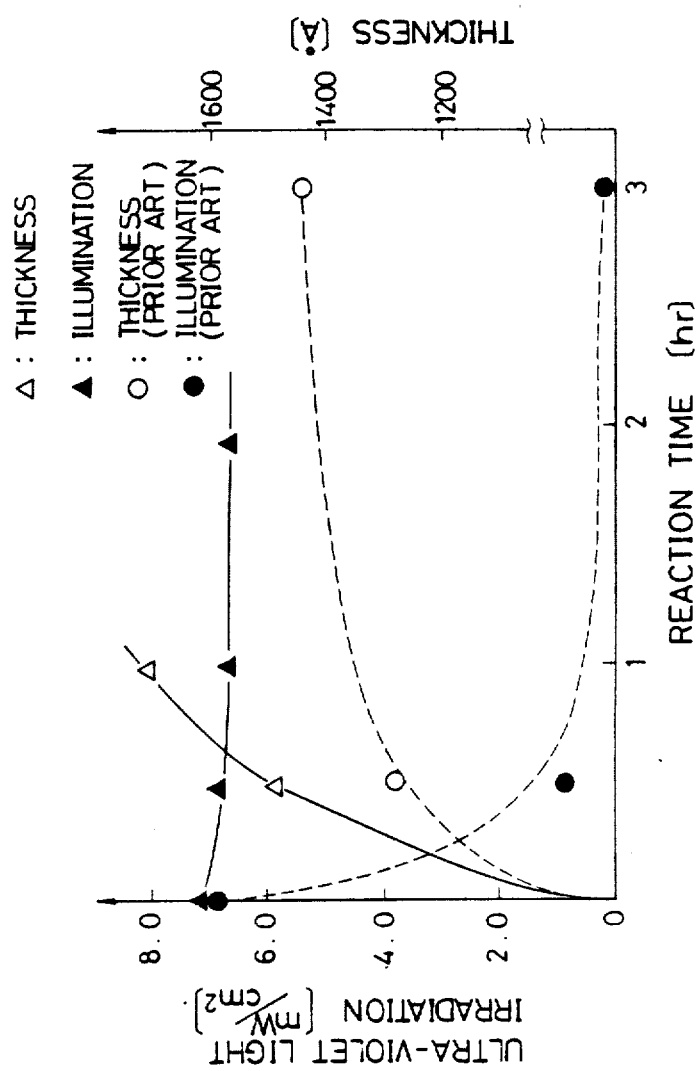
FIG. 5 is a graph showing the experimental results for comparison between the present invention and the prior art.

FIG. 5 shows the experimental results obtained with the apparatus shown in FIG. 3. In this experiment, He was used as the purging inert gas g' and $SiH_4$ was supplied as the reaction gas g into the reaction chamber 24. Then the ultraviolet light R having the main wavelength of 2,537 angstroms was irradiated to form a film of amorphous silicon (a-Si:H) on the substrate 25'. FIG. 5 shows how the film forming rate and the irradiation intensity vary with time with and without purging gas g'. The advantages of the present invention over the prior art are obvious from the results shown in FIG. 5.

Now, a further aspect of the present invention will be described with particular reference to FIGS. 6 and 7. According to this aspect of the present invention, there is provided a method and apparatus capable of manufacturing a photoconductive film excellent in quality having no voids and pin halls at an increased rate. First, the underlying principle of this aspect of the present invention will be described. That is, in the case of photodecomposition reaction using mercury as a promotor, when ultraviolet light having frequency $\nu$ is irradiated to $SiH_4$ gas and mercury vapor present in the vicinity of the top surface of the substrate, the mercury vapor becomes photoexcited as indicated by the following expression (3), and because of this, the reactions as indicated by expressions (4) and (5) take place.

$$Hg + h\nu \rightarrow Hg^* \qquad (3)$$

$$Hg^* + N_2 \rightarrow Hg^{**} + N_2^{(*)} \qquad (4)$$

$$Hg^* + SiH_4 \rightarrow SiH_2 + H_2 + Hg \qquad (5)$$

Here, $Hg^*$ and $Hg^{**}$ indicate photoexcited mercury atoms different in energy level, and their energies are 112.7 Kcal/mole (4.86 eV) and 107.0 Kcal/mole (4.64 eV) and their relaxation times are $1.14 \times 10^{-7}$ sec and $1 \times 10^{-3}$ sec. Thus, the molecules having the binding or dissociation energy which is larger than 112.7 Kcal/mole or at least larger than 100 Kcal/mole are not decomposed by photoexcited mercury atoms $Hg^*$ and even if decomposed, its efficiency is very low.

Under the circumstances, in accordance with this aspect of the present invention, the reaction gas containing such a gas as $N_2$, $CH_4$, $NH_3$ and $H_2$, which is difficult to be decomposed, is preliminarily activated prior to the processing according to the photoexcited CVD method, thereby enhancing the decomposition efficiency to increase the rate of film formation. Accordingly, in accordance with this aspect of the present invention, the reaction as indicated by the following expression (6) for the gas having a relatively large binding or dissociation energy is enhanced thereby allowing to form a film, for example, from $Si_3N_4$ at an increased rate.

$$3SiH_4(g) + 4NH_3(g) \rightarrow Si_3N_4(s) + 12H_2(g) \qquad (6)$$

Figure 6:
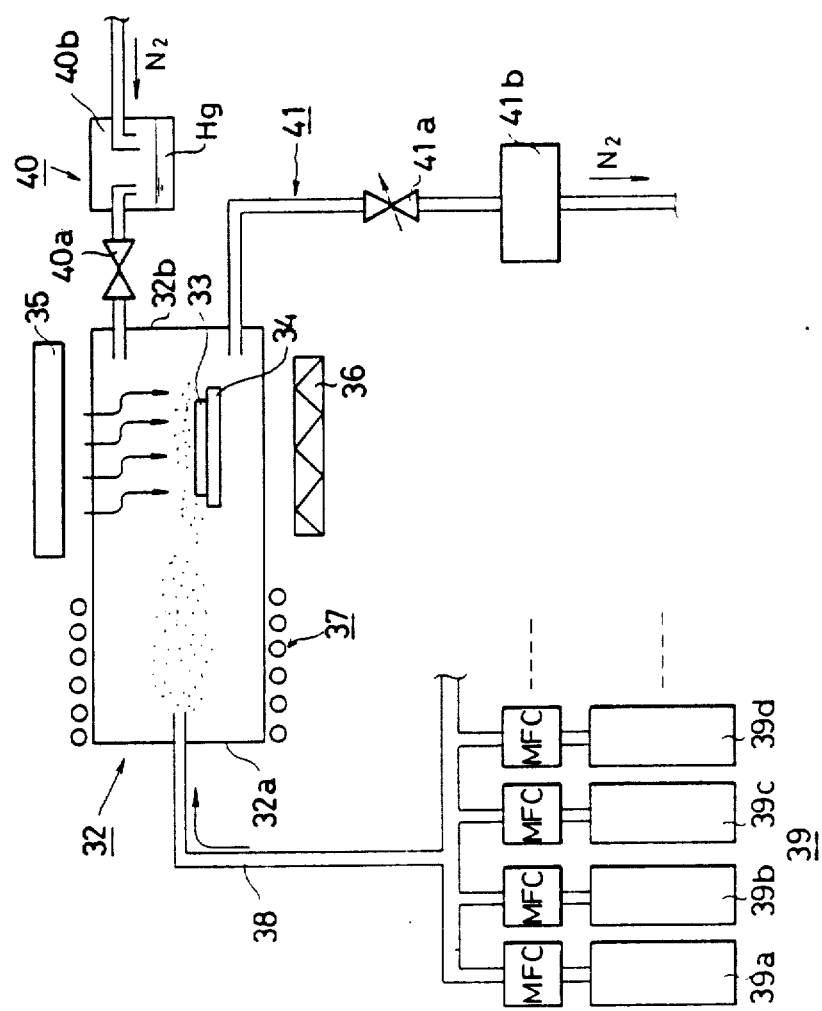
FIG. 6 is a schematic illustration showing the apparatus for carrying out the two-step process in accordance with the present invention.

FIG. 6 schematically shows the overall structure of apparatus for manufacturing a photoconductive film from amorphous silicon according to the photoexcited CVD process with the pretreatment of reaction gas in accordance with the present invention. As shown in FIG. 6, there is provided a cylindrical reaction chamber 32 of quartz, which extends horizontally. Inside of the reaction chamber 32 is disposed a plate-shaped support table 34 as located closer to a right-hand end plate 32b of the reaction chamber 32, and a substrate 33, on which a film of photoconductor is to be formed, is placed on the table 33. A light source 35, such as a low-pressure mercury lamp, is disposed outside of the reaction chamber 32 as opposed to the top surface of the substrate 33 placed on the table 34. In the present embodiment, the light source emits ultraviolet light having the main wavelength of 253.7 nm directed against the top surface of the substrate 33. A heater 36, such as a halogen lamp, for maintaining the temperature of the substrate 33 in a predetermined range is disposed also outside of the reaction chamber 32 at the side opposite to the side of the light source 35 with respect to the reaction chamber 32.

Also provided at the left-hand end, which is the entrance side, of the reaction chamber 32 as fitted thereon is an induction heater 37 which is connected to a rf source (not shown). The heater 32 causes the gas entering into the reaction chamber 32 to be heated by induction. A supply pipe 38 extends into the interior of the reaction chamber 32 through its left-hand end plate 32a, and the supply pipe 38 is connected to a plurality of gas supply sources 39 through respective mass flow controllers MFCs. Each of the gas supply sources 39a, 39b, etc. contains a particular species gas which is a component to form a reaction gas to be supplied into the reaction chamber 32.

On the other hand, through the right-hand end plate 32b extends a pipe system 40 which includes a valve 40a and a reservoir storing therein a quantity of mercury, and nitrogen gas $N_2$ as a carrier gas is fed into this pipe system 40 for supplying mercury vapor into the reaction chamber 32. Another pipe system 41 is provided to extends through the right-hand end plate 32b and it includes a valve 41a and an evacuation pump 41b for evacuating the reaction chamber 32 to a vacuum condition suitable for photochemical reaction.

In operation, the substrate 33 is placed on the support table 34 and then the reaction chamber 32 is sealed. Then, the valve 41a is opened while operating the evacuation pump 41b to establish the vacuum condition inside of the reaction chamber 32 approximately at $10^{-3}$ Torr. Then, the heater 36 is activated to heat the substrate 33 to a desired temperature, which can be lower in level, e.g., 100° C. or lower, than that required by the prior art. The pre-treatment induction heater 37 is also activated by applying rf current thereto thereby preparing to heat the gas passing through the entrance region of the reaction chamber 32 which is followed by the photoexcitation region in which the substrate 33 is located.

Under the condition, while keeping the vacuum condition inside of the reaction chamber 32 substantially unchanged, the valve 40a is opened to have the carrier gas of nitrogen, together with mercury vapor, introduced into the reaction chamber 32. The low-pressure mercury lamp 35 is turned on to emit the ultraviolet light having the wavelength of 253.7 nm, and, at the same time, a reaction gas, which is comprised as a combination of various species gases from the gas supply sources, is introduced into the reaction chamber 32 via the pipe 38. The reaction gas thus introduced into the reaction chamber 32 is preliminarily activated as being supplied with thermal energy while passing through the pre-treatment region defined by the induction heater 37. The reaction gas thus having been preliminarily activated then reaches the vicinity of the substrate 33 where it is subjected to photoexcited CVD reaction. Thus, the deposition takes place on the top surface of the substrate 33 to form a film thereon. In this case, in accordance with the present invention, those reaction gas components as $NH_3$ and $H_2$, which are relatively difficult to be decomposed, can be easily activated or decomposed since they have been preheated by the induction heater 32. Thus, the photoexcited CVD process takes place efficiently and a film of $Si_3N_4$ can be formed on the substrate at an increased rate. It has been found that the resulting film is virtually free of pin holes and voids.

Figure 7:
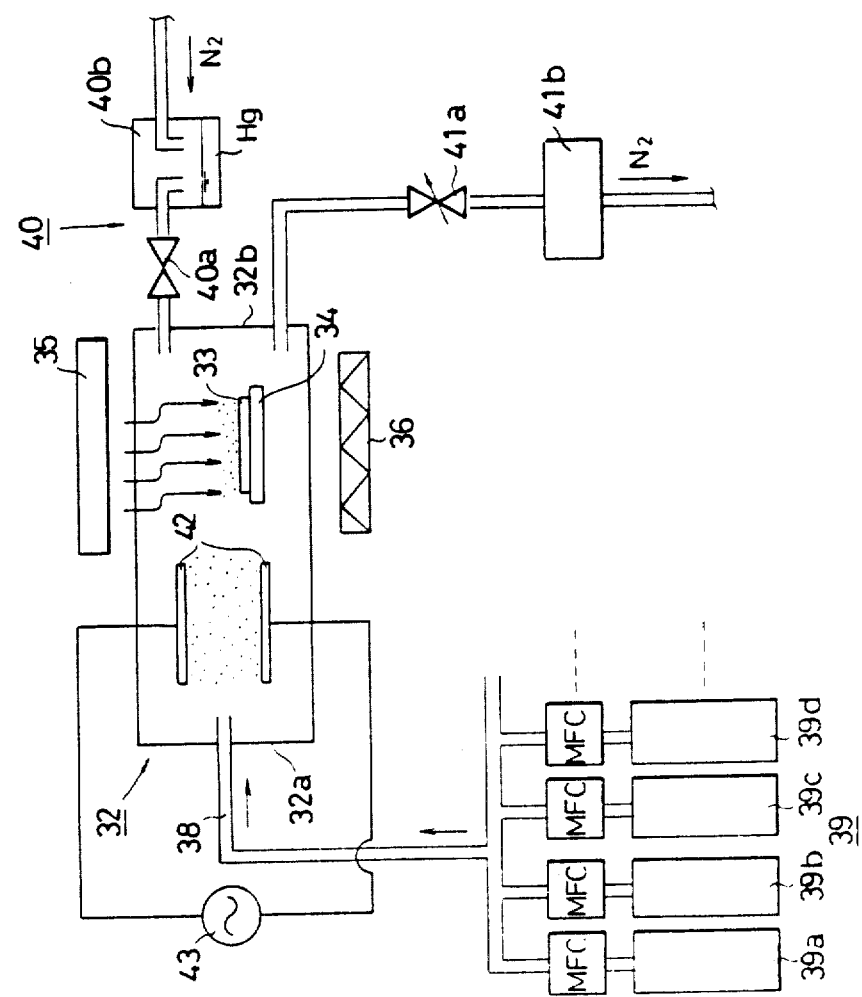
FIG. 7 is a schematic illustration showing the structure modified from the structure of FIG. 6.

FIG. 7 shows a modified structure which is in many respects similar to the structure shown in FIG. 6. The embodiment shown in FIG. 7 only differs from the embodiment of FIG. 6 in that it employs plasma energy of glow discharge in the pre-treatment step of reaction gas. Described more in detail, a pair of parallel plates 42, 42 are disposed inside of the reaction chamber 32 in the pre-treatment region thereof. The parallel plates 42, 42 are connected to a voltage source 43, which, for example, applies an alternating voltage of 100 V peak to cause glow discharge between the plates 42 and 42. It is to be noted that such a two-step process can be very effective so that there are cases where use of mercury vapor is not necessary.

Figure 8:
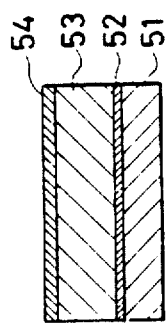
FIG. 8 is a cross sectional view showing the structure of a preferred photosensitive member constructed in accordance with the present invention.

FIG. 8 shows in cross section a photosensitive member which can be manufactured in accordance with any of the methods described above and which is suitable for use in electrophotography. As shown, the illustrated photosensitive member only shows part of entire structure which can be plate-shaped or drum-shaped, etc. In the structure shown in FIG. 8, on a substrate or support 51 is formed an interface blocking layer 52 preferably having the thickness from 100 to 5,000 angstroms. On the interface blocking layer 52 is formed a photoconductive layer 53 preferably having the thickness of 5 microns or more, which is covered by a top blocking layer 54 preferably having the thickness in the range between 100 and 5,000 angstroms. The preferred parameters to be used in manufacturing the structure shown in FIG. 8 include the substrate temperature of 200° C., pressure of 3.0 Torr and ultraviolet light (2,537 angstroms) power of 10 mW/cm$^2$ at substrate surface. In addition, the composition of the gas to be used for forming the top and interface blocking layers 52 and 54 includes SiH$_4$ of 10 SCCM and NH$_3$ of 200 SCCM; on the other hand, the composition of the gas for forming the photoconductive layer 53 includes SiH$_4$ of 50 SCCM, NH$_3$ of 100 SCCM and B$_2$H$_6$(1,000 ppm) /H$_2$ of 20 SCCM.

While the above provides a full and complete disclosure of the preferred embodiments of the present invention, various modifications, alternate constructions and equivalents may be employed without departing from the spirit and scope of the invention. For example, the wave length of the ultraviolet light applicable to the present invention is not limited to the one described above, and the reacting gas other than SiH$_4$ gas may also be used. Accordingly, the present method is equally applicable in manufacturing photosensitive members having photoconductive layers formed from materials other than amorphous silicon. It should be noted that use may be made of a light source which emits not only ultraviolet light but also infrared light. Besides, the present invention may be combined with the plasma CVD method. Therefore, the above description and illustration should not be construed as limiting the scope of the invention, which is defined by the appended claims.

What is claimed is:

1. A method of manufacturing a photosensitive member including a substrate and a photoconductive layer formed on said substrate, comprising the steps of:
   placing said substrate in a reaction chamber having a preheating region and a photoexcitation region, said substrate being placed in said photoexcitation region;
   introducing a reacting gas containing predetermined components for forming said photoconductive layer on said substrate into said reaction chamber first through said preheating region for preheating said reacting gas and then through said photoexcitation region; and
   irradiating ultraviolet light in said photoexcitation region to activate said predetermined components while maintaining said substrate at a predetermined temperature level thereby causing said predetermined components to deposit on said substrate by photochemical reaction.

2. The method of claim 1 wherein said preheating is carried out by induction heating.

3. The method of claim 1 wherein said preheating is carried out by glow discharge.

4. The method of claim 1 wherein said photoconductive layer includes amorphous silicon at least partly.

5. The method of claim 4 wherein said reacting gas contains SiH$_4$ as one component.

6. The method of claim 1 wherein said reaction chamber is evacuated before said step of introducing the reacting gas.

7. The method of claim 6 wherein said reaction chamber is supplied with N$_2$ gas following the step of evacuation but before the step of introducing the reacting gas.

8. The method of claim 1 wherein said reaction chamber is cylindrical in shape and the reacting gas flows along the longitudinal axis of said cylindrical reaction chamber, whereby said preheating region is defined as an upstream portion of said cylindrical reaction chamber with the rest defining said photoexcitation region.

9. A method of manufacturing a photosensitive member including a substrate and a photoconductive layer formed on said substrate, comprising the steps of:
   placing said substrate in a reaction chamber;
   introducing a reacting gas containing predetermined components for forming said photoconductive layer on said substrate into said reaction chamber; and
   irradiating ultraviolet light from the exterior of said reaction chamber to activate said predetermined components while maintaining said substrate at a predetermined temperature and at the same time directing a purge gas at least against a selected portion of the inner surface of a wall defining said reaction chamber, through which said ultraviolet light passes, to keep said selected portion free of deposition, thereby causing said predetermined components to deposit on said substrate.

10. The method of claim 9 wherein said photoconductive layer includes amorphous silicon at least partly.

11. The method of claim 10 wherein said reacting gas contains SiH$_4$ as one component.

12. The method of claim 9 wherein said purge gas is an inert gas which is substantially not decomposed by irradiation of ultraviolet light.

13. The method of claim 12 wherein said inert gas is a gas selected from the group consisting of He, Ar, Xe and N$_2$.

* * * * *